United States Patent
Oka et al.

(10) Patent No.: US 8,502,385 B2
(45) Date of Patent: Aug. 6, 2013

(54) POWER SEMICONDUCTOR DEVICE

(75) Inventors: Seiji Oka, Tokyo (JP); Tetsuya Ueda, Tokyo (JP)

(73) Assignee: Mitsubishi Electric Corporation, Tokyo (JP)

( * ) Notice: Subject to any disclaimer, the term of this patent is extended or adjusted under 35 U.S.C. 154(b) by 51 days.

(21) Appl. No.: 13/150,593

(22) Filed: Jun. 1, 2011

(65) Prior Publication Data

US 2012/0098138 A1    Apr. 26, 2012

(30) Foreign Application Priority Data

Oct. 20, 2010    (JP) ................................ 2010-235094

(51) Int. Cl.
  *H01L 23/48* (2006.01)
  *H01L 23/498* (2006.01)

(52) U.S. Cl.
  USPC ............. 257/773; 257/E23.01; 257/E25.016; 257/E23.169; 257/E21.499; 257/774; 257/693; 257/717; 257/697; 257/698; 257/170; 257/177; 257/499; 257/226; 257/615; 257/692; 257/691; 257/712; 257/713; 257/676; 257/77

(58) Field of Classification Search
  USPC ................... 257/773, 774, E23.01, E21.499, 257/E23, 169, 693, 717, 697, 698, 170, 177, 257/499, 226, 615, 692, 691, 712, 713, 676, 257/77
  See application file for complete search history.

(56) References Cited

U.S. PATENT DOCUMENTS

| | | | | |
|---|---|---|---|---|
| 7,557,421 | B1 * | 7/2009 | Shealy et al. | 257/499 |
| 7,816,781 | B2 * | 10/2010 | Thoben et al. | 257/693 |
| 8,258,618 | B2 * | 9/2012 | Obiraki et al. | 257/697 |
| 2003/0173579 | A1 * | 9/2003 | Ishii et al. | 257/177 |
| 2007/0215999 | A1 * | 9/2007 | Kashimoto et al. | 257/678 |
| 2008/0158830 | A1 * | 7/2008 | Tominaga et al. | 361/722 |
| 2010/0013085 | A1 | 1/2010 | Oi | |
| 2010/0013086 | A1 * | 1/2010 | Obiraki et al. | 257/693 |
| 2010/0055845 | A1 * | 3/2010 | Ikawa et al. | 438/123 |
| 2010/0117216 | A1 * | 5/2010 | Lu et al. | 257/692 |
| 2010/0117219 | A1 * | 5/2010 | Oka et al. | 257/693 |
| 2010/0127383 | A1 | 5/2010 | Oka | |
| 2010/0127389 | A1 * | 5/2010 | Obiraki et al. | 257/712 |

(Continued)

FOREIGN PATENT DOCUMENTS

JP    62-142338    6/1987
JP    1-191455    8/1989

(Continued)

*Primary Examiner* — A O Williams
(74) *Attorney, Agent, or Firm* — Oblon, Spivak, McClelland, Maier & Neustadt, L.L.P.

(57) ABSTRACT

A power semiconductor device has the power semiconductor elements having back surfaces bonded to wiring patterns and surface electrodes, cylindrical communication parts having bottom surfaces bonded on the surface electrodes of the power semiconductor elements and/or on the wiring patterns, a transfer mold resin having concave parts which expose the upper surfaces of the communication parts and cover the insulating layer, the wiring patterns, and the power semiconductor elements. External terminals have one ends inserted in the upper surfaces of the communication parts and the other ends guided upward, and at least one external terminal has, between both end parts, a bent area which is bent in an L shape and is embedded in the concave part of the transfer mold resin.

10 Claims, 7 Drawing Sheets

U.S. PATENT DOCUMENTS

| | | | |
|---|---|---|---|
| 2010/0133681 A1* | 6/2010 | Oka et al. | 257/693 |
| 2010/0133684 A1* | 6/2010 | Oka et al. | 257/712 |
| 2010/0134979 A1 | 6/2010 | Obiraki | |
| 2011/0049531 A1* | 3/2011 | Oka et al. | 257/77 |
| 2011/0187003 A1* | 8/2011 | Oi et al. | 257/773 |
| 2012/0091573 A1* | 4/2012 | Sasaki et al. | 257/717 |

FOREIGN PATENT DOCUMENTS

| | | |
|---|---|---|
| JP | 8-288427 | 11/1996 |
| JP | 11-204724 | 7/1999 |
| JP | 2010-27813 | 2/2010 |

* cited by examiner

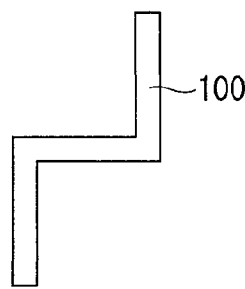
F I G . 1 0
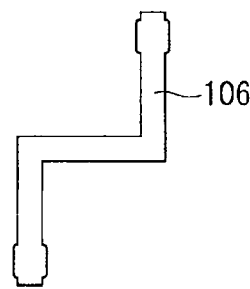
F I G . 1 1
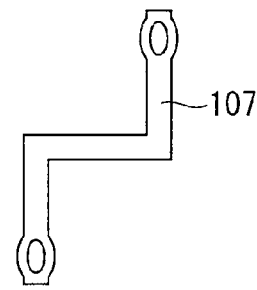
F I G . 1 2
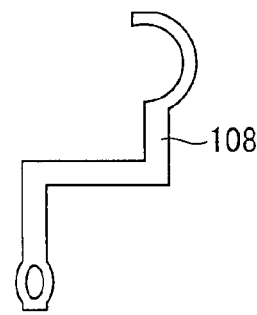
F I G . 1 3

POWER SEMICONDUCTOR DEVICE

BACKGROUND OF THE INVENTION

1. Field of the Invention

The present invention relates to a power semiconductor device and, more particularly, to a power semiconductor device of a transfer mold resin sealing type which can miniaturize and reduce cost of the power semiconductor device and which can also miniaturize a printed wiring board connected to the power semiconductor device.

2. Description of the Background Art

A power semiconductor device generally operates under a large current and high voltage, and therefore it is important to miniaturize and reduce cost of such a power module while decreasing thermal resistance and securing high insulating performance.

For example, as disclosed in Japanese Patent Application Laid-Open No. 11-204724 (1999), there is a structure in which power semiconductor elements are mounted on lead frames on which wiring patterns of a predetermined electrical circuit are formed, one surface of a metal substrate formed with an aluminum plate or copper plate, a high thermally-conductive insulating layer and a copper foil is soldered, and then the entirety is sealed by a transfer mold resin such that the other surface of the metal substrate is exposed. This structure miniaturizes and reduces cost of a power module of a transfer mold resin sealing type, and simplifies manufacturing steps.

The conventional technique disclosed in Japanese Patent Application Laid-Open No. 11-204724 (1999) realizes a miniaturized power semiconductor device, and miniaturizes and reduces cost of the power semiconductor device by using lead frames formed with punching press and providing a high thermally-conductive metal substrate directly below the lead frames on which the power semiconductor elements are mounted. However, this conventional technique adopts a structure which cannot provide a satisfying effect as a structure for realizing a miniaturized power semiconductor device at reduced cost.

That is, the power semiconductor device of a transfer mold resin sealing type using a lead frames according to the conventional technique adopts a structure which can take out lead frames which serve as terminals, only from a side surface peripheral direction of the power semiconductor device because of the transfer step, and, after the device is sealed with a transfer mold resin, it is necessary to cut a tie bar part of the lead frames for separating various electrodes, and perform bending processing of the lead parts which are external terminals to be mounted on the printed wiring board.

Further, metals of the external terminals formed with these leads are exposed and are not insulated. Therefore, it is necessary to secure an insulating distance between the external terminals, and, even if a mold resin sealing part on which the power semiconductor element is mounted and sealed is miniaturized, the size of the power semiconductor device is defined according to the insulating distance between the external terminals for securing the insulating distance between lead external terminals projecting from side surfaces, and therefore miniaturization is limited.

As one solution for this problem, a method of taking out external terminals from the upper surface of the power semiconductor device is possible. That is, a method of arranging external electrodes in the surface is possible. This method is applied to recent light electrical semiconductor devices, and, taking into account this idea, area array packages such as PGA packages in which pin electrodes made of metal are formed on a surface instead of lead frames are being developed.

That is, it is possible to miniaturize a semiconductor device by arranging external terminals on a planar surface. By applying this method to a power semiconductor device, external terminals can be taken out while maintaining the insulating distance in the planar surface, so that it is possible to miniaturize the power semiconductor device.

However, external terminals are formed directly above the surface of the power semiconductor device, and therefore the positions to take out the external terminals largely depend on the layout of the power semiconductor elements in the power semiconductor device and drawing of a pattern of a printed wiring board bonded with a power semiconductor device by the external terminals become complicated, and, there is a problem that flexibility of pattern design of the printed wiring board is lost and the printed wiring board becomes large.

SUMMARY OF THE INVENTION

It is an object of the present invention to provide a power semiconductor device which can draw external terminals in desired positions while maintaining insulating distances above power semiconductor elements, and which can be miniaturized.

The power semiconductor device has a power semiconductor element having a back surface bonded to a wiring pattern on an underlayer and a surface electrode on a surface opposing to the back surface, a cylindrical communication part having a bottom surface bonded on the surface electrode of the power semiconductor element and/or on the wiring pattern, a transfer mold resin having a concave part which exposes an upper surface of the communication part and covering surfaces other than the upper surface of the communication part, the underlayer, the wiring pattern and the power semiconductor element, and an external terminal which has one end inserted in the upper surface of the communication part and has the other end guided upward. At least one external terminal has, between both end parts, a bent area which is bent in an L shape. The bent area is embedded in the concave part of the transfer mold resin.

The power semiconductor device according to the present invention can reduce the distance between terminals on the device while maintaining a creepage insulating distance above the power semiconductor elements, and can draw external terminals in desired positions and can be miniaturized.

These and other objects, features, aspects and advantages of the present invention will become more apparent from the following detailed description of the present invention when taken in conjunction with the accompanying drawings.

BRIEF DESCRIPTION OF THE DRAWINGS

FIG. 10 is a structure diagram of an L-shaped external terminal for solder bonding according to a third preferred embodiment of the present invention;

FIGS. 11 and 12 are structure diagrams of an L-shaped external terminal for press fit bonding according to the third preferred embodiment of the present invention;

FIGS. 13 and 14 are structure diagrams of an L-shaped external terminal for spring bonding according to the third preferred embodiment of the present invention;

DESCRIPTION OF THE PREFERRED EMBODIMENTS

A. First Preferred Embodiment

A-1. Configuration

Figure 1:
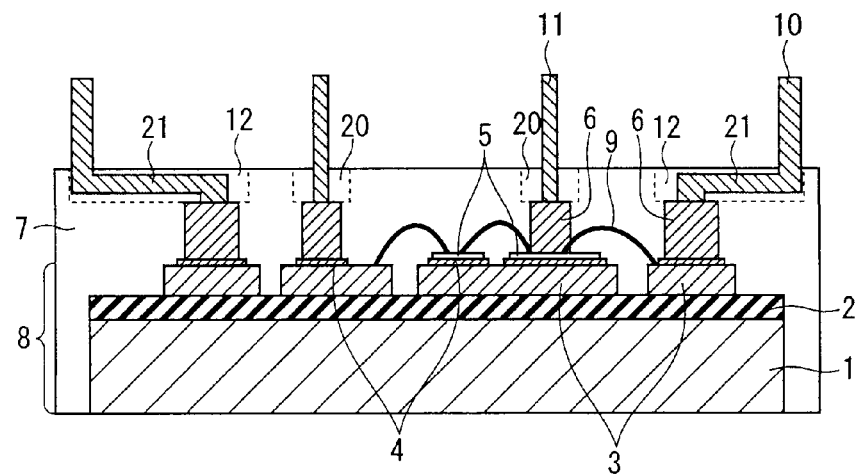
FIG. 1 is a schematic sectional view illustrating a power semiconductor device according to the first preferred embodiment of the present invention.

FIG. 1 is a schematic sectional view illustrating a power semiconductor device according to a first preferred embodiment of the present invention. As illustrated in FIG. 1, with the power semiconductor device according to the first preferred embodiment, a high thermally-conductive insulating layer 2 which serves as an underlayer is provided on one surface (upper surface) of a metal plate 1 which serves as a metal heat dissipator for releasing heat of the power semiconductor device. Further, on the upper surface of this high thermally-conductive insulating layer 2, wiring patterns 3 of metal foils are formed. The metal plate 1, high thermally-conductive insulating layer 2, and wiring patterns 3 form a metal circuit substrate 8 which serves as a circuit substrate.

On the wiring patterns 3, power semiconductor elements 5, and cylindrical communication parts 6 are bonded through solder 4 substantially vertically. The power semiconductor element 5 is bonded to the wiring pattern 3 through its back surface and has a surface electrode in its top surface opposing to the back surface, and the bottom surface of the communication part 6 is bonded on the surface electrode of the power semiconductor element 5 and/or the wiring pattern 3. Further, wire bonds 9 electrically connect between the wiring pattern 3 and the wiring pattern 3, between the power semiconductor element 5 and the power semiconductor element 5, and between the wiring pattern 3 and the power semiconductor element 5.

Further, the surface of the metal circuit substrate 8 on which the wiring patterns 3 are formed, peripheral side surfaces, and outer sides of the power semiconductor elements 5, the wire bonds 9, and the cylindrical communication parts 6 are sealed by a transfer mold resin 7. However, the transfer mold resin 7 is not filled in concave parts 12 and concave parts 20 positioned above the communication parts 6, and the upper surfaces of the communication parts 6 are formed to be exposed. In the communication parts 6, L-shaped external terminals 10 and linear-shaped external terminals 11 are respectively inserted. One ends of the external terminals 10 and external terminals 11 are inserted in the upper surfaces of the communication parts 6, and the other ends are guided upward. In addition, although the concave parts 12 and concave parts 20 are formed to match the shapes of the external terminals 10 and external terminals 11 to be inserted, for example, in its arrangement, the concave parts 12 may be arranged in the upper surfaces of the communication parts 6 above the power semiconductor elements 5 and, in this case, the corresponding external terminals 10 are inserted in the concave parts 12, so that the external terminals 10 are arranged above the power semiconductor elements 5.

With the first preferred embodiment, a composite material such as a metal having good thermal conductivity including, for example, aluminum and an aluminum alloy, copper and a copper alloy, iron and an iron alloy, or copper/iron-nickel alloy/copper, aluminum/iron-nickel alloy/aluminum may be used for the metal plate 1. Particularly, when the power semiconductor elements 5 having large current capacity are used, it is preferable to use copper having good thermal conductivity. Further, the thickness, length, and width of metal plate 1 are adequately determined according to the current capacity of the power semiconductor elements 5. That is, when the current capacity of the power semiconductor elements 5 becomes greater, the metal plate 1 is made thicker and the length and width of the metal plate 1 are increased.

Further, with the first preferred embodiment, for example, a resin insulating sheet containing various ceramics or inorganic powders or a resin insulating sheet containing glass fibers may be used for the high thermally-conductive insulating layer 2. The inorganic powders contained in the high thermally-conductive insulating layer 2 include alumina, beryllia, boron nitride, magnesia, silica, silicone nitride, and aluminum nitride. Further, the thickness of high thermally-conductive insulating layer 2 is, for example, 20 to 400 micrometers.

Further, with the first preferred embodiment, copper foils are, for example, used for the wiring patterns 3, and aluminum wires are used for the wire bonds 9. The thickness of copper foils used for the wiring patterns 3 and the wire diameter and, also, the number of aluminum wires used for the wire bonds 9 are adequately determined according to the current capacity of the power semiconductor elements 5.

Further, metal cylinders are, for example, used for the cylindrical communication parts 6, and metal which has good thermal conductivity and electrical conductivity and which can be bonded by the wiring patterns 3 and the solder 4 such as plated materials of copper and a copper alloy, or aluminum and an aluminum alloy is preferably used for the material of the metal cylinders. The thickness of cylindrical communication parts 6 is adequately determined according to the current capacity such that the communication parts 6 are not deformed by molding pressure upon transfer molding.

The height of the communication parts 6 only needs to have a height which sufficiently allows connection of external terminals which are subsequently inserted and connected. The inner diameter of the communication parts 6 is determined according to the external diameters of insertion parts of the L-shaped external terminals 10 and linear-shaped external terminals 11 which are subsequently inserted and connected, and only needs to have at least an inner diameter which allows attachment of the external terminals 10 and external terminals 11. Further, the inner diameter of the cylindrical communication parts 6 at the end part on the transfer mold resin surface side is made equal to or greater than the inner diameter of the center part. By so doing, the external terminals 10 and external terminals 11 are easily inserted to the communication parts 6.

Further, a tapered shape is provided to the communication part 6 to improve wettability of the solder 4 used for bonding the wiring patterns 3 and communication parts 6 and improve reliability. Further, the concave parts 12 and concave parts 20 of the communication parts 6 sealed by the transfer mold resin 7 also have tapered shapes, and these tapered shapes provide an advantage of facilitating insertion of the external terminals 10 and external terminals 11 which are subsequently inserted, into the communication parts 6.

With the first preferred embodiment, although the orientations of the tapered shapes are the same in both of the bottom surface which is soldered and the upper surface which is sealed by a transfer mold resin, even if the orientations of the tapered shapes are opposite in the bottom surface which is soldered, it is possible to provide the effect of the present invention. Further, the angles of the tapered shapes are adequately changed according to, for example, the type of solder.

Further, with the first preferred embodiment, an epoxy resin in which silica powders are filled as filler is, for example, used for the transfer mold resin 7. For the content percentage of silica powders to be filled in the transfer mold resin 7, the optimal amount is selected taking into account the thermal expansion factor of a member which is used in the power semiconductor device.

When, for example, copper is used for the wiring patterns 3 and the metal plate 1, the amount of silica powders to fill in the epoxy resin is set such that the thermal expansion factor of the transfer mold resin 7 to match 16 ppm/° C. which is the thermal expansion factor of copper. By so doing, it is possible to provide a power semiconductor device which includes no warpage.

Further, to improve heat releasing performance of the transfer mold resin 7, it is preferable to use alumina powders as filler instead of silica powders.

A-2. Manufacturing Process

Next, an example of a power semiconductor device manufacturing method according to the first preferred embodiment will be described. The power semiconductor device according to the first preferred embodiment is made by, for example, disposing as the high thermally-conductive insulating layer 2 an epoxy resin sheet containing alumina powders of the B stage state on a copper plate having the thickness of 3 mm which is the metal plate 1, and overlaying the copper foil having the thickness of 0.3 mm on the epoxy resin sheet.

A laminate obtained by laminating the copper plate, epoxy resin sheet containing alumina powders, and the copper foil are heated and pressured, and the copper plate and copper foil are bonded by means of the epoxy resin sheet containing alumina powders. Next, the wiring patterns 3 are formed by etching the copper foil.

Thus, the metal circuit substrate 8 including the metal plate 1 made of copper, the insulating layer 2 of the epoxy resin containing alumina powders, and wiring patterns 3 of copper is formed.

Next, using the solder 4, the power semiconductor elements 5 are bonded to the element mounting part provided in random places on the wiring patterns 3, and then the cylindrical communication parts 6 are bonded in the bonded parts with the external terminals 10 and external terminals 11 provided in random places on the wiring patterns 3.

Then, the portions which need to be conducted between the wiring pattern 3 and the wiring pattern 3, between the power semiconductor element 5 and the power semiconductor element 5, and between the wiring pattern 3 and the power semiconductor element 5 are connected through the aluminum wire bonds 9. Further, with the first preferred embodiment, although the wiring patterns 3 and the power semiconductor elements 5 are connected by the wire bonds 9, the present invention is not limited to this and can provide the effect of the present invention as long as other components which allow electrical connection are used.

With the above formation procedure of performing soldering and wire-bonding, the wire bonds 9 are punched after all parts are solder-bonded, and therefore, when the power semiconductor elements 5 or other wiring patterns 3 are wire-bonded on the wiring patterns 3 conducted with the communication parts 6, there is a possibility that the wire bonds cannot be punched nearby due to the height of the communication parts 6 because of restriction of the wire bonding device. Therefore, there is limitation in the mounting area. Hence, there is the next method as a method of further reducing the mounting area. This method includes soldering and then wire-bonding the wiring patterns 3 and power semiconductor elements 5, and then bonding the wiring patterns 3 and communication parts 6. Bonding is performed in two steps, so that the wiring patterns 3 and communication parts 6 are bonded using low-temperature soldering or other bonding methods than soldering. For example, there is an adhering method using silver paste and a method using ultrasonic bonding.

Next, the metal circuit substrate 8 on which the wire-bonded power semiconductor elements 5 and communication parts 6 are mounted is set in a mold, and is sealed by the epoxy resin transfer mold resin 7 in which, for example, silica powders are filled by the transfer mold method.

The above-described present invention is not limited to the metal circuit substrate 8, and it is also possible to obtain the effect of the present invention by using the ceramic substrate as a component.

The external terminals 10 and the external terminals 11 are inserted in the communication parts 6 sealed by the transfer mold resin 7.

For the shape of external terminals such as the external terminals 10 and the external terminals 11 to be connected with the communication parts 6, although the L-shaped external terminals 10 are preferably used for the communication parts 6 in which the external terminals 10 are inserted, there is no problem even if the linear-shaped external terminals 11 which are vertically inserted as is in the communication parts 6 are used in combination.

Even by partially using the L-shaped external terminals 10, the positions of portions to connect the external device can be designed at random in the power semiconductor device and external device connected through the external terminals 10.

That is, even when a power semiconductor device is used which is designed according to positions of the power semiconductor elements 5 and communication parts 6 such that the power semiconductor device is miniaturized most, by using the L-shaped external terminals 10, the portions to connect the external devices matching the communication parts 6 of the power semiconductor device can be set at random positions, so that it is possible to miniaturize the external device and provide wirings which can reduce electrical loss.

As an example of reduction of electrical loss, in case of the power semiconductor device adopting the 2-in-1 structure which uses IGBT elements and diode elements as power semiconductor elements 5, by using two L-shaped external terminals for respective external terminals connected with P electrode cylindrical communication part and N electrode cylindrical communication part formed in the power semiconductor device, it is possible to arrange terminals adjacent to each other and draw wirings bonded to the external device in parallel wiring, and reduce the inductance.

By contrast with this, when only the linear-shaped external terminals 11 are used as bonding terminals of the power semiconductor device and the external device, it is necessary to provide the portions to connect the external device directly above the communication parts 6, and therefore there is a problem that optimal circuit drawing is difficult in the external device and, at the same time, the external device becomes large.

A-3. Configuration of Communication Part

Figure 2:
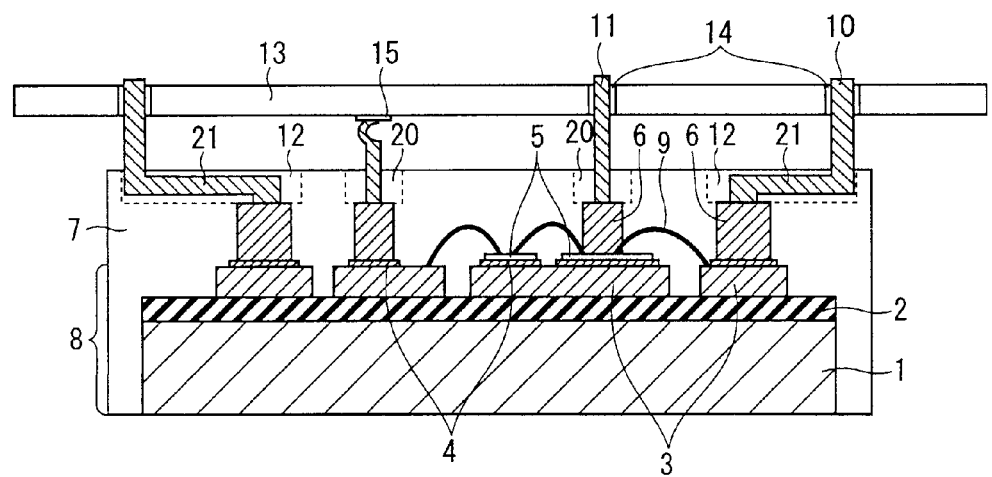
FIG. 2 is a schematic sectional view illustrating that a printed wiring board which is an external device and a power semiconductor device are connected through external terminals according to the first preferred embodiment of the present invention.

FIG. 2 is a schematic sectional view illustrating that a printed wiring board 13 which is an external device and the power semiconductor device are connected through the external terminal 10 and the external terminal 11 according to the first preferred embodiment of the present invention. With the L-shaped external terminals 10 and the linear-shaped external terminals 11, one front ends of the external terminals 10 and the external terminals 11 are inserted in the communication parts 6 and, at the same time, the other front ends are bonded to through-hole parts 14 or land parts 15 of the printed wiring board 13 which is the external device, it is possible to collectively connect the power semiconductor device and printed wiring board 13 using the external terminals 10 and the external terminals 11, so that the procedure is simple and long-term reliability can be improved.

Although not illustrated in the schematic sectional view, mounting parts for driving the power semiconductor device such as resistance parts, capacitor parts, transformer parts, and microcomputer parts are mounted on the printed wiring board 13 which is the external device.

Figure 3:
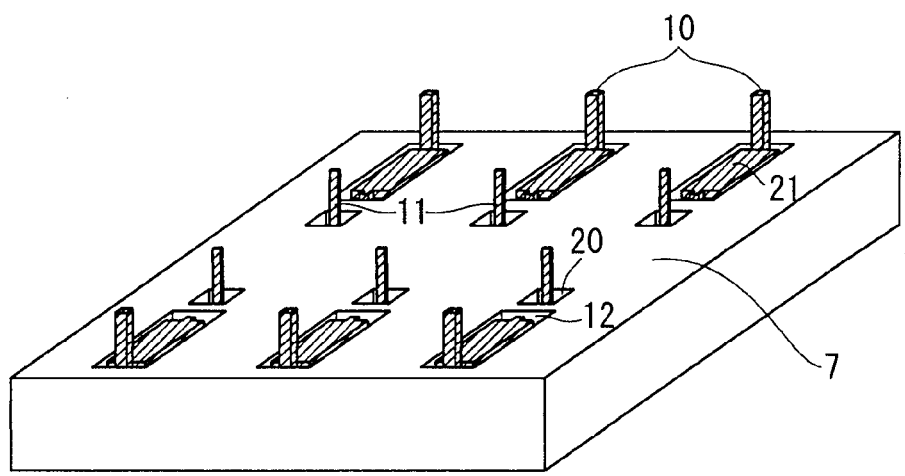
FIG. 3 is a bird's eye view illustrating that external terminals are embedded in concave parts formed on a transfer mold resin surface on the upper surface of the power semiconductor device according to the first preferred embodiment of the present invention.

FIG. 3 is a bird's eye view illustrating that the communication parts 6, and through-hole parts 14 of the printed wiring board 13 or the side which is not bonded to the land parts 15 in the L-shaped external terminals 10, that is, bent areas 21 of the external terminals 10, are embedded in concave parts 12 of the external terminals formed on the surface of the transfer mold resin 7 on the upper surface of the power semiconductor device.

By embedding the bend areas 21 of the L-shaped external terminals 10, in the concave parts 12 of the external terminals on the transfer mold resin, the creepage insulating distance between adjacent different electrode external terminals becomes long, so that it is possible to reduce the interval between the different electrode external terminals to a predetermined creepage distance and, consequently, miniaturize the power semiconductor device.

Figure 4:
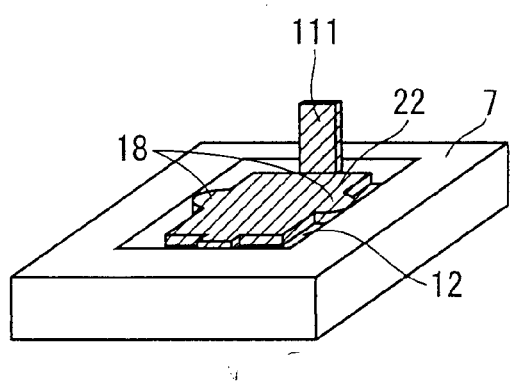
FIG. 4 is a structure diagram of an L-shaped external terminal according to the first preferred embodiment of the present invention.

FIG. 4 illustrates a case where fixing projections 18 with respect to the concave part 12 are formed in a bent area 22 of a external terminal 111 which is embedded in the concave part 12 formed in the surface of the transfer mold resin 7 described in the first preferred embodiment.

By providing the fixing projections 18, the L-shaped external terminal 111 is fixed with high positioning precision in the concave part 12 formed in the surface of the transfer mold resin. By this means, the precision of the position of the front end part of the external terminal 111 with respect to the through-hole part 14 or the land part 15 of the printed wiring board 13 improves, so that insertion is facilitated and, at the same time, reliability after bonding also improves.

By using, for example, SiC of a wide bandgap semiconductor for the power semiconductor elements 5, it is possible to improve the current density and miniaturize the power semiconductor device. The same applies to the following preferred embodiments.

A-4. Effect

With the first preferred embodiment according to the present invention, a power semiconductor device has the power semiconductor elements 5 which have back surfaces bonded to the wiring patterns 3 on the insulating layer 2 serving as an underlayer and which have surface electrodes on surfaces opposing to the back surfaces, the cylindrical communication parts 6 which have bottom surfaces bonded on the surface electrodes of the power semiconductor elements 5 and/or on the wiring patterns 3, the transfer mold resin 7 which has concave parts 20 and concave parts 12 which expose the upper surfaces of the communication parts 6 and which covers surfaces other than the upper surfaces of the communication parts 6, the insulating layer 2, the wiring patterns 3, and the power semiconductor elements 5, and the external terminals 10 and 11 which have one ends inserted in the upper surfaces of the communication parts 6 and have the other ends guided upward, and at least one external terminal 10 has between both end parts the bent area 21 which is bent in an L shape and the bent area 21 is embedded in the concave part 12 of the transfer mold resin 7, so that it is possible reduce the distance between terminals on the power semiconductor device while maintaining a creepage insulating distance above the power semiconductor elements 5, and draw external terminals in desired positions and miniaturize the power semiconductor device.

Further, with the first preferred embodiment of the present invention, the power semiconductor device further has a printed wiring board arranged above the external terminals 11 and external terminals 10, and the other ends of the external terminals 11 and external terminals 10 are bonded to the through-hole parts 14 or the land part 15 of the printed wiring board 13, so that, even when the external terminals 11 and external terminals 10 are inserted and bonded to the through-hole parts 14 or bonded to the land part 15, it is possible to collectively connect the printed wiring board 13 with the through-hole parts 14 or bonded to the land part 15 and design the printed wiring board 13 without limitation. Further, long-term reliability improves.

Further, with the first preferred embodiment according to the present invention, in the power semiconductor device, the external terminal 111 has projections 18 which engage with the side surfaces of the concave part 12 of the transfer mold resin 7 in the bent area 22, so that the L-shaped external terminal 111 is fixed with high positioning precision in the concave part 12 formed on the surface of the transfer mold resin and precision of the position of the front end part of the external terminal 111 improves, and, consequently, insertion is facilitated and, at the same time, reliability after bonding also improves.

B. Second Preferred Embodiment

B-1. Configuration

FIGS. 5 to 9 are structure diagrams of L-shaped external terminals where L-shaped external terminals have one or more portions to be bonded in the communication parts 6 and portions to be bonded to the through-hole parts 14 or the land part 15 of the printed wiring board 13.

Figure 5:
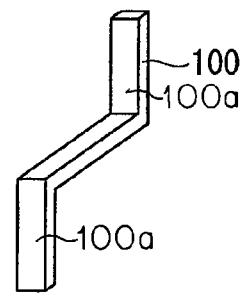
FIGS. 5 to 9 are structure diagrams of an L-shaped external terminal according to a second preferred embodiment of the present invention.

FIG. 5 is a structure diagram of the L-shaped external terminal 100 having one portion to be bonded in the communication part 6 and one portion to be bonded to the printed wiring board 13.

Figure 6:
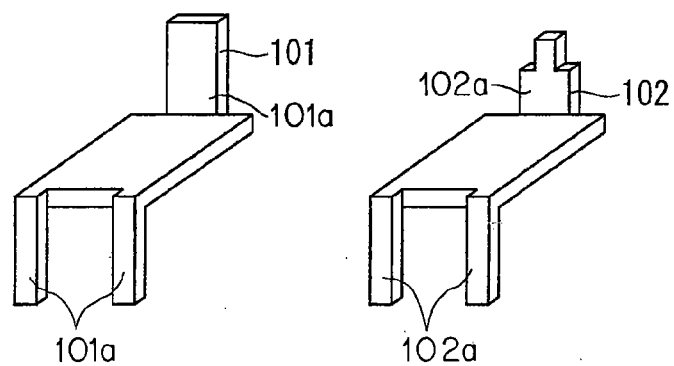

FIG. 6 is a structure diagram of an L-shaped external terminal 101 and external terminal 102 which have two portions to be bonded in the communication part 6 and one portion to be bonded to the printed wiring board 13.

Figure 7:
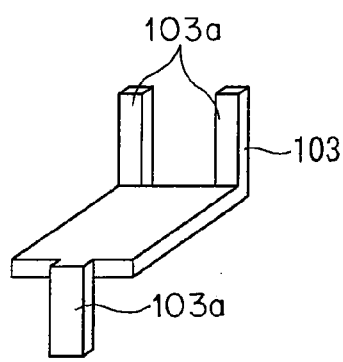

FIG. 7 is a structure diagram of an L-shaped external terminal 103 which has one portion to be bonded in the communication part 6 and two portions to be bonded to the printed wiring board 13.

Figure 8:
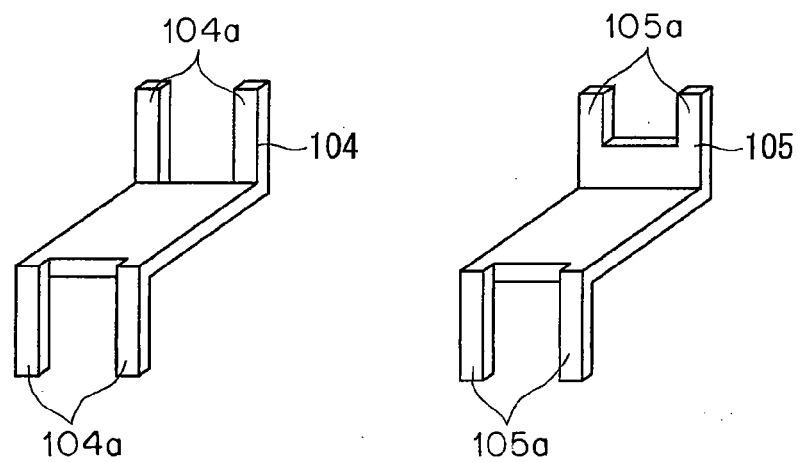

FIG. 8 is a structure diagram of an L-shaped external terminal 104 and external terminal 105 which have two portions to be bonded in the communication part 6 and two portions to be bonded to the printed wiring board 13.

When the current capacity is relatively small in the power semiconductor device, there is no problem if the L-shaped external terminal 100 illustrated in FIG. 5 having one bonding portion at either front end is used. However, if energization is performed with only one connector 100a in the power semiconductor device having large current capacity, partial (local) heat generation occurs, thereby causing problems such as cracks of soldering, peeling or thermal resistance of the printed wiring board 13, and therefore the reliability of the device decreases.

In these cases, by increasing the number of portions of the energizers as illustrated in FIGS. 6 to 8, it is possible to solve the problem that the current capacity increases and heat generation is concentrated, and the reliability of the device improves. However, by contrast with this, the numbers of communication parts 6, and through-hole parts 14 and land parts 15 of the printed wiring board 13 in the power semiconductor device increase and there is a possibility that miniaturization is prevented, and therefore it is necessary to optimize and use the shapes and the number of the connectors.

Figure 9:
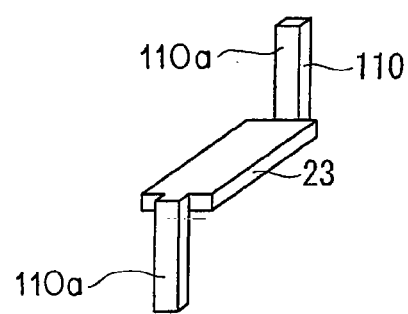

When SiC which is a wide bandgap semiconductor is used for the power semiconductor element 5, it is preferable to use a L-shaped external terminal 110 illustrated in FIG. 9 following improvement of the current density.

By widening the width of the bent area 23 compared to the general power semiconductor elements 5 (when Si is used), the external terminal 110 can suppress its heat generation and can decrease loss of the power semiconductor device.

B-2. Effect

With the second preferred embodiment according to the present invention, in the power semiconductor device, the external terminals 100 to 105 and external terminal 110 respectively have one or a plurality of connectors 100a to 105a and 110a at their both ends, so that it is possible to optimize the shape and the number of connectors taking into account the degree of concentration of heat generation and the demand for miniaturization.

Further, with the second preferred embodiment according to the present invention, in the power semiconductor device, the bent area 23 of the external terminal 110 has a wider width in a direction substantially orthogonal to the length direction of the external terminal 110 than the width of the other areas of the external terminal 110, so that, even when the current density increases in case where SiC which is a wide bandgap semiconductor is used for the power semiconductor elements 5, it is possible to adequately support the increase in the current density.

Further, with the second preferred embodiment according to the present invention, in the power semiconductor device, the power semiconductor elements 5 are formed with wide bandgap semiconductors, so that the current density of the power semiconductor device improves and the power semiconductor device can be further miniaturized.

C. Third Preferred Embodiment

C-1. Configuration

FIG. 10 illustrates the structure of the external terminal 100 when solder bonding is used as a method of bonding the L-shaped external terminal 100 to the communication part 6, and through-hole part 14 and land part 15 of the printed wiring board 13.

By using solder bonding, the shape of the front end of the external terminal 100 does not need to be devised, so that it is possible to reduce cost of external terminals. For a material of the L-shaped external terminal 100 used for solder bonding, a good electrically conductive material such as copper or a copper alloy is preferable. In order to perform solder bonding, tin or nickel plating is used where necessary. The above solder bonding is applied to the linear-shaped external terminals 11 in the same manner.

FIGS. 11 and 12 illustrate structures of an L-shaped external terminal 106 and external terminal 107 which use press fitting as a method of bonding the external terminal 106 and external terminal 107 to the communication part 6 and through-hole part 14 of the printed wiring board 13.

For example, FIG. 11 illustrates the L-shaped external terminal 106 having a press fit shape of a structure which swages the front end which is generally referred to as "a star pin".

FIG. 12 illustrates the L-shaped external terminal 107 having a press fit shape which is generally referred to as "a compliant pin".

The shapes are not limited to these two types, and the external terminal 106 and the external terminal 107 each having, for example, the C press fit shape or Σ press fit shape may also be used. For materials of the external terminal 106 and external terminal 107 each using press fit, a copper alloy material which has spring characteristics and good electrical conductivity is preferably used.

By using press fit bonding, it is possible to perform solderless bonding, thereby improving reliability of bonding portions and reducing assembly processing cost. In addition, the above bonding using the press fit can be applied to the linear-shaped external terminals 11 in the same manner.

Figure 14:
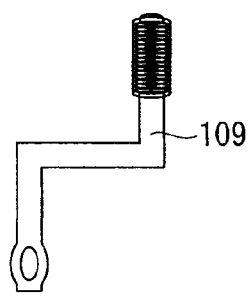

FIGS. 13 and 14 illustrate structures of an L-shaped external terminal 108 and external terminal 109 when a spring is used as a method of bonding the external terminal 108 and external terminal 109 to the communication part 6 and the land part 15 of the printed wiring board 13.

For example, FIG. 13 illustrates the external terminal 108 having a C-shaped spring.

FIG. 14 illustrates the external terminal 109 having a general spring shape.

The shapes are not limited to these two types, and any shape may be used as long as the shape enables bonding using the spring function. For materials of the external terminal 108 and external terminal 109 each using the spring function, a copper alloy material which has spring characteristics and, at the same time, has good electrical conductivity is preferably used.

By realizing bonding by means of the spring function, bonding is realized by means of only the land part 15 of the printed wiring board 13, and the through-hole parts 14 become unnecessary, so that it is possible to miniaturize the printed wiring board 13. In addition, the above bonding using the spring can be applied to the linear-shaped external terminals 11 in the same manner.

Although a method of bonding the L-shaped external terminals 10 and linear-shaped external terminals 11 to the communication part 6, and through-hole part 14 and land part 15 of the printed wiring board 13 has been specifically described, there is no problem even if different bonding methods are used in combination at both ends of external terminals.

C-2. Effect

With the third preferred embodiment according to the present invention, in the power semiconductor device, at least one end part of the external terminals 106 and external terminals 107 is bonded using press fit, thereby enabling solderless bonding, so that it is possible to improve reliability of bonded parts and reduce assembly processing cost.

Further, with the third embodiment according to the present invention, in the power semiconductor device, at least one end part of the external terminals 108 and external terminals 109 is bonded using a spring, thereby enabling bonding by means of only the land part 15 of the printed wiring board 13, and the through-hole parts 14 become unnecessary, so that it is possible to miniaturize the printed wiring board 13.

D. Fourth Preferred Embodiment

D-1. Configuration

Figure 15:
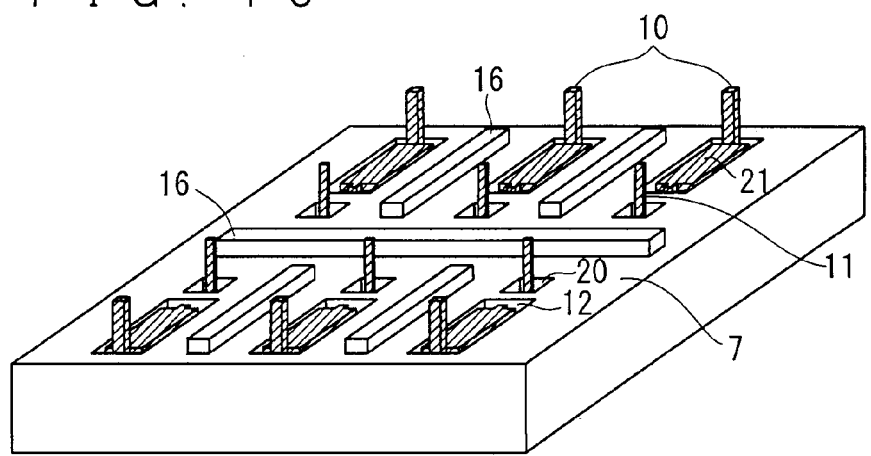
FIG. 15 is a structure diagram of a power semiconductor device in which convex shapes are formed according to a fourth preferred embodiment of the present invention.

FIG. 15 illustrates a power semiconductor device in which convex shapes 16 are formed on the surface of the transfer mold resin 7 between the external terminals 10 and further between external terminals 11 of different electrodes drawn on the upper surface of the power semiconductor device.

By providing the insulating convex shapes 16 formed on the surface of the transfer mold resin 7 between the external terminals 10 and further between external terminals 11 of different electrodes, the creepage distance can be increased, so that it is possible to reduce a substantial lateral distance between the external terminals 10 and between external terminals 11, miniaturize the power semiconductor device and reduce cost.

Figure 16:
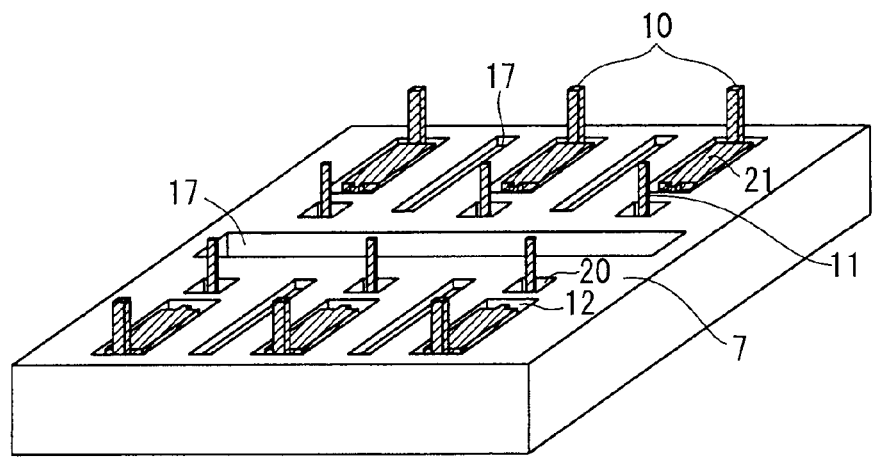
FIG. 16 is a structure diagram of a power semiconductor device in which concave shapes are formed according to the fourth preferred embodiment of the present invention.

FIG. 16 illustrates a power semiconductor device in which concave shapes 17 are formed on the surface of the transfer mold resin 7 between the external terminals 10 and further between external terminals 11 of different electrodes drawn on the upper surface of the power semiconductor device.

By providing the concave shapes 17 between the external terminals 10 and further between external terminals 11 of different electrodes, the creepage distance can be increased, so that it is possible to reduce a lateral distance between the L-shaped external terminals 10, miniaturize the power semiconductor device and reduce cost.

In addition, one power semiconductor device may have a mix of the convex shapes 16 and concave shapes 17.

D-2. Effect

With the fourth preferred embodiment according to the present invention, in the power semiconductor device, the transfer mold resin 7 has a plurality of concave parts 20 and concave parts 12 and the transfer mold resin 7 has the convex shapes 16 and/or concave shapes 17 between the predetermined concave parts 20 and concave parts 12, thereby increasing the creepage distance, so that it is possible to reduce a substantial lateral distance between the external terminals 10 and between external terminals 11, miniaturize the power semiconductor device and reduce cost.

Although the quality of material, material, and implementation conditions of each component are disclosed with the preferred embodiments of the present invention, these are illustrative and are not limited to the above disclosure.

While the invention has been shown and described in detail, the foregoing description is in all aspects illustrative and not restrictive. It is therefore understood that numerous modifications and variations can be devised without departing from the scope of the invention.

What is claimed is:

1. A power semiconductor device comprising:
   a power semiconductor element having a back surface bonded to a wiring pattern on an underlayer and a surface electrode on a surface opposing to said back surface;
   a cylindrical communication part having a bottom surface bonded on at least one of said surface electrode of said power semiconductor element and said wiring pattern;
   a transfer mold resin having a concave part which exposes an upper surface of said communication part and covering surfaces other than said upper surface of said communication part, said underlayer, said wiring pattern, and said power semiconductor element; and
   a plurality of external terminals, each having one end inserted in said upper surface of said communication part and an other end guided upward, wherein
   at least one of said external terminals has, between said one end and said other end, a bent area which is bent in an L shape, and said bent area is embedded in said concave part of said transfer mold resin.

2. The power semiconductor device according to claim 1, further comprising a printed wiring board arranged above said plurality of external terminals, wherein the other end of each of said external terminals is bonded to a through-hole part of said printed wiring board.

3. The power semiconductor device according to claim 1, wherein at said bent area, said at least one external terminal has a projection which engages with a side surface of said concave part of said transfer mold resin.

4. The power semiconductor device according to claim 1, wherein each of said external terminals has at least one connector at each end of the respective external terminal.

5. The power semiconductor device according to claim 1, wherein said bent area of said at least one external terminal has a wider width in a direction substantially orthogonally to a length direction of said external terminal than a width of other areas of said at least one external terminal.

6. The power semiconductor device according to claim 1, wherein said power semiconductor element is made of a wide bandgap semiconductor.

7. The power semiconductor device according to claim 1, wherein at least either end part of each of said external terminals is bonded using a press fit.

8. The power semiconductor device according to claim 1, wherein at least either end part of each of said external terminals is bonded using a spring.

9. The power semiconductor device according to claim 1, wherein
   said transfer mold resin has a plurality of said concave parts each of which is identical; and
   said transfer mold resin has at least one of a convex shape and a concave shape between said concave parts.

10. The power semiconductor device according to claim 1, further comprising a printed wiring board arranged above said plurality of external terminals, wherein the other end of each of said external terminals is bonded to a land part of said printed wiring board.

\* \* \* \* \*